United States Patent [19]
Yasaitis

[11] Patent Number: 5,086,370
[45] Date of Patent: Feb. 4, 1992

[54] INTEGRATED CIRCUIT CHIP FORMED WITH A CAPACITOR HAVING A LOW VOLTAGE COEFFICIENT, AND METHOD OF MAKING SUCH CAPACITOR

[75] Inventor: John A. Yasaitis, Lexington, Mass.

[73] Assignee: Analog Devices, Incorporated, Norwood, Mass.

[21] Appl. No.: 572,751

[22] Filed: Aug. 24, 1990

[51] Int. Cl.$^5$ .................. H01G 1/015; H01G 4/10; H01G 7/00

[52] U.S. Cl. .................. 361/313; 29/25.42; 357/51

[58] Field of Search .............. 361/311, 312, 313, 320, 361/321; 357/51

[56] References Cited

U.S. PATENT DOCUMENTS

| 4,589,056 | 5/1986 | Stimmell | 361/311 |
| 4,628,405 | 12/1986 | Lippert | 361/321 |
| 4,638,400 | 1/1987 | Brown et al. | 361/304 |

FOREIGN PATENT DOCUMENTS

| 92679 | 8/1978 | Japan | 357/51 |
| 89854 | 5/1983 | Japan | 357/51 |

Primary Examiner—Donald A. Griffin
Attorney, Agent, or Firm—Parmelee, Bollinger & Bramblett

[57] ABSTRACT

An integrated-circuit (IC) chip formed with a capacitor comprising a lower layer of polysilicon clad with a thin film of TiSi$_2$ serving as the lower plate of the capacitor, a layer of dielectric, a thin film of titanium nitride (TiN) on the upper surface of the dielectric to serve as the upper plate of the capacitor, a second layer of polysilicon (doped with phosphorous) over the TiN film, and metallization to make contact with the top plate of the capacitor.

27 Claims, 1 Drawing Sheet

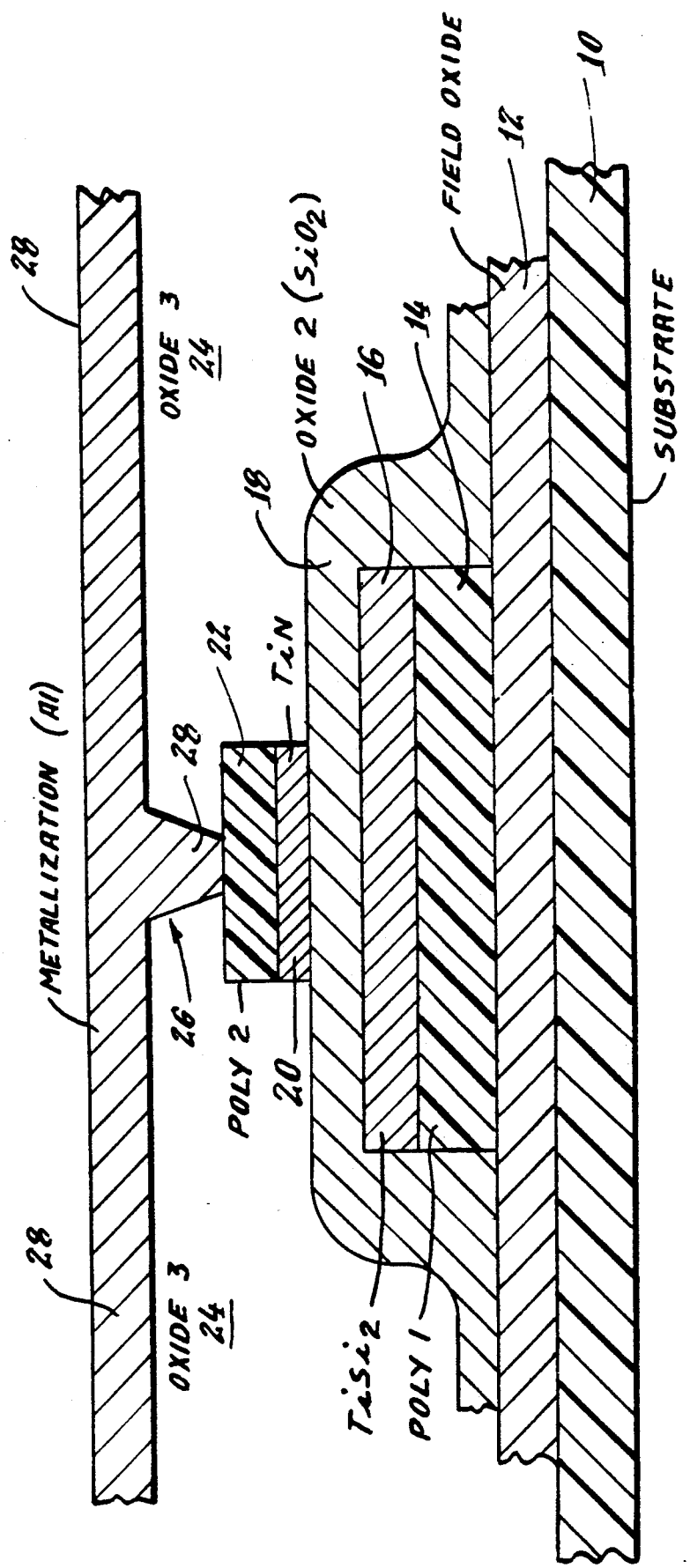

INTEGRATED CIRCUIT CHIP FORMED WITH A CAPACITOR HAVING A LOW VOLTAGE COEFFICIENT, AND METHOD OF MAKING SUCH CAPACITOR

BACKGROUND OF THE INVENTION

1. Field of the Invention

This invention relates to integrated-circuit (IC) chips including capacitor elements formed during the IC processing. More particularly, this invention relates to IC capacitor elements having improved performance characteristics, particularly a low variation in capacitance with change in applied voltage.

2. Description of the Prior Art

Integrated circuit chips commonly are made with capacitor elements which are integral parts of the circuitry on the chip. Conventionally, such capacitors are of the so-called "double poly" type, wherein both capacitor plates (upper and lower) are formed of polysilicon (i.e., silicon having a multiple crystalline structure rather than a monocrystalline structure). Capacitors also have been made wherein the upper surface of the lower polysilicon layer is clad with titanium silicide (TiSi$_2$), which is a conductive material capable of serving as the lower plate of the capacitor. It also has been proposed to employ the IC metallization material (typically Aluminum) as the upper plate of the capacitor.

Prior art capacitors, although commercially useful, have not been fully satisfactory in certain respects. For example, double-poly capacitors generally have not had a sufficiently low voltage coefficient, which represents the amount of change in capacitance with change in applied voltage. Integrated circuits intended for high-performance applications, such as those involving high-resolution A/D and D/A converters, generally require a voltage coefficient less than 10 parts per million (ppm).

SUMMARY OF THE INVENTION

In a preferred embodiment of the invention, described hereinbelow in detail, an IC chip is formed with a capacitor of the type wherein the lower plate comprises a layer of polysilicon clad with a layer of titanium silicide (TiSi$_2$), covered with the dielectric material (SiO$_2$). The upper plate of this capacitor comprises a thin film of TiN formed on the upper surface of the dielectric. Above the TiN is a layer of polysilicon, doped to provide conductivity. Electrical connection from the upper capacitor plate to the overlying layer of metallization is made through the doped polysilicon.

Both capacitor plates have high levels of free electron density at their surfaces, and there is minimal free carrier depletion (relative to polysilicon). Such depletion as does occur is more symmetric than when the plates are formed of polysilicon and silicide.

Other objects, aspects and advantages of the invention will in part be pointed out in, and in part apparent from, the following description considered together with the accompanying drawing.

BRIEF DESCRIPTION OF THE DRAWING

The single drawing FIGURE illustrates the cross-sectional arrangement (not to scale) of an IC capacitor formed in accordance with the invention.

DESCRIPTION OF THE PREFERRED EMBODIMENT

Referring now to the drawing, there is shown at the bottom a conventional substrate 10 of the kind typically employed for making an integrated circuit. Ordinarily, this substrate will be silicon, doped with either P or N impurity. Various transistor devices (not shown) will be formed in other regions of this substrate, and are interconnected so as to make an integrated circuit having a particular functional purpose, such as converting digital signals to analog signals (i.e., a so-called D/A converter, or DAC). The processing of the substrate is carried out at the wafer level, although the drawing shows only a portion of a single chip.

Conventionally, the substrate 10 will be formed with field oxide 12 surrounding the regions containing the active devices (transistors). Such a field oxide process may be of the kind sometimes referred to as "LOCOS" ("local oxidation"), and is effected by thermally-growing silicon oxide (SiO$_2$) on the substrate at a high temperature such as 1000° C.

In carrying out a preferred embodiment of this invention, a layer 14 of polysilicon (Poly 1) is deposited over the field oxide, as by chemical vapor deposition (CVD). The upper surface of the polysilicon then is formed (in accordance with known processes) with a thin layer 16 of titanium silicide (TiSi$_2$) which is to serve as the lower plate for the capacitor. In one particular embodiment, the polysilicon layer 14 had a thickness of about 3500 Å, and was clad by a film of TiSi$_2$ with a thickness of about 1200 Å. The lateral dimensions of these layers 14 and 16 are fixed at prescribed sizes appropriate to the intended application, as by known etching techniques. For example, the layers can be separately etched, or stack-etching can be employed. In any event, the two layers preferably are aligned, as shown in the drawing.

In many MOS processes, polysilicon clad with TiSi$_2$ (or a similar film) is deposited to form gates for the MOS transistors. To make the polysilicon conductive, it is diffused with dopant such as phosphorous. Commonly, long strips of such material are laid down, to serve as conductors for the electrical signals to the gates.

In making a capacitor in accordance with the present invention, it is convenient to deposit the polysilicon layer 14 as part of such conventional processing for MOS gates, including the step of diffusing phosphorous dopant (or another suitable impurity) into the polysilicon. However, establishing the polysilicon as electrically conductive is not a requirement for a capacitor made in accordance with the present invention.

The next step in making a capacitor in accordance with the preferred embodiment is to deposit a layer 18 of silicon oxide (SiO$_2$) over the TiSi$_2$ film 16 to serve as the dielectric for the capacitor. The dielectric thickness may with advantage be about 750 Å. This dielectric preferably is a high quality oxide applied for example by chemical vapor deposition (CVD), e.g. at a temperature of about 420° C. Alternatively, the capacitor dielectric may be SiO$_2$ deposited by plasma-enhanced chemical vapor deposition (PECVD), or by low pressure chemical vapor deposition (LPCVD). A still further alternative is to form the dielectric by depositing silicon nitride (Si$_3$N$_4$), or silicon nitride together with silicon oxide. This deposition is applied over the entire wafer.

Thereafter, a thin (e.g. 50 to 1000 Å, and preferably 400 Å) film of titanium is laid down over the dielectric layer 18, as by conventional sputter deposition. This titanium film then is reacted with nitrogen to form a layer 20 of titanium nitride (TiN). By this process, a refractory metal (titanium) is transformed into a refractory compound.

The TiN layer 20 may be formed by direct reaction between the titanium and an $N_2$ or $NH_3$ ambient at temperatures ranging from 450° C. to 700° C. Alternatively, the TiN layer may be formed by reactive sputter deposition of Ti in an $N_2$ ambient. It also may be formed by sputter deposition from a TiN target.

Over the layer 20 of TiN is deposited a second layer 22 of polysilicon (Poly 2). This layer 22 serves several functions. It protects the thin layer of TiN from subsequent IC process steps. It also provides conductive connection to the TiN and acts as an "etch stop", as will be understood from the following description.

The lateral dimensions of the layer of TiN are set, as by known etching techniques, to establish an appropriate area size for the upper plate of the capacitor being formed. The dimensions of the second polysilicon layer 22 may be set correspondingly, and the two layers aligned. The thickness of the TiN layer may be about 600 Å, and the polysilicon thickness may be about 3500 Å. The polysilicon of this layer (Poly 2) is doped in known manner to make it electrically conductive, as by diffusion of phosphorous into the polysilicon.

A third layer 24 of silicon oxide ($SiO_2$) then is applied over the already-formed capacitor elements, as by chemical vapor deposition. Alternative deposition techniques, such as described above for the capacitor dielectric 18, can also be used. A contact hole 26 is formed through this oxide 24, immediately above the Poly 2 layer, as by known etching.

A layer 28 of metallization (typically Aluminum) then is laid down over the oxide 24. A portion of this metallization will extend down through the contact hole 26 to make electrical connection to the layer 22 (Poly 2). Since the polysilicon is conductive, this will establish electrical connection from the metallization 28 to the layer 20 of TiN (which is the upper plate of the capacitor).

Electrical connection may be made to the lower capacitor plate (i.e., the layer 16 of $TiSi_2$) by various known means (not shown), such as by extending the layer 16 laterally to a location where connection to it can be made through a separate contact hole through the oxide 24.

A capacitor formed as described above has a number of important advantages. For example, the capacitor plates 16 and 20 have minimal free carrier depletion (as compared to polysilicon), due to near-metallic electron densities at the surfaces of the plates adjacent the dielectric 18. If some depletion does occur, it is more symmetric than would be the case for a polysilicon-polycide capacitor, i.e., a capacitor having one plate made of polysilicon and the other made of polysilicon with a layer of a silicide adjacent the dielectric. The voltage coefficient of the new capacitor is significantly improved, relative to a double-poly capacitor and especially a poly-polycide capacitor, for example to a value less than 10 parts per million/volt.

Both the layer 16 of $TiSi_2$ and the layer 20 of TiN are metallic-like materials; that is, these materials have metal-like concentrations of free electrons, to provide conductivities corresponding to metals, as distinguished, for example, from semi-conductors. Alternative materials for the lower plate layer 16 are considered to be $CoSi_2$ and $WSi_2$. Alternative materials for the upper layer 20 are considered to be TiW and W.

The layer 20 of TiN is unaffected by the etchant used to make the contact hole 26, because of the presence of the polysilicon layer 22; that is, the Poly 2 layer serves as an "etch stop". TiN is a refractory material which can withstand refractory temperatures, which for purposes of the present invention are defined as temperatures of 900° C. and above. Post capacitor thermal processing at such temperatures can be carried out without damaging the capacitor plate. It should also be noted that the upper layer 22 of polysilicon does not have to be heavily doped, so that lower-temperature doping cycles can be used, compatible with modern CMOS processing.

Although a preferred embodiment of the invention has been disclosed herein in detail, it is to be understood that this is for the purpose of illustrating the invention, and should not be construed as necessarily limiting the scope of the invention since it is apparent that many changes can be made by those skilled in the art while still practicing the invention claimed herein.

What is claimed is:

1. An integrated-circuit (IC) chip incorporating a capacitor as part of the integrated circuitry, said chip comprising:

a substrate having an upper surface;

a first layer of polysilicon above said substrate upper surface;

a layer of a silicide above and in contact with said first layer of polysilicon to serve as the lower plate of the capacitor;

dielectric material above and in contact with said silicide layer;

a layer of an electrically-conductive refractory material in contact with the upper surface of said dielectric and serving as the upper plate of said capacitor; and a layer of conductively-doped polysilicon above and in contact with said refractory layer.

2. An IC chip as in claim 1, wherein said conductive material is a metallic-like material with a high density of free electrons.

3. An IC chip as in claim 1, including a layer of field oxide between said substrate and said first layer of polysilicon.

4. An IC chip as in claim 1, wherein said second layer of polysilicon is doped for electrical conductivity, to provide for electrical connection through said doped polysilicon to said refractory material.

5. An IC chip as in claim 1, wherein said refractory material is selected from the group of TiN, TiW and W.

6. An IC chip as in claim 1, wherein said refractory material is TiN.

7. An IC chip as in claim 1, wherein said silicide layer comprises material selected from the group of $TiSi_2$, $CoSi_2$ or $WSi_2$.

8. An IC chip as in claim 1, wherein said capacitor dielectric is plasma enhanced CVD oxide.

9. An IC chip as in claim 1, wherein said capacitor dielectric is $Si_3N_4$.

10. An IC chip as in claim 1, wherein said capacitor dielectric includes both $Si_3N_4$ and $SiO_2$.

11. An IC chip as in claim 1, wherein said capacitor dielectric is low pressure CVD oxide.

12. In an integrated-circuit (IC) chip incorporating a capacitor element of the type comprising spaced-apart lower and upper layers of polysilicon supported on a substrate with a dielectric therebetween, and wherein the upper surface of the lower polysilicon layer is formed with a thin layer of metallic-like material capable of withstanding refractory temperatures and serving as the lower plate of the capacitor;

that improvement in said capacitor element comprising a layer of a refractory, metallic-like material at the upper surface of said dielectric and beneath said upper layer of polysilicon to serve as the upper plate of said capacitor.

13. An IC chip as in claim 12 wherein said upper layer of polysilicon is doped to provide it with conductivity to establish electrical connection from a layer of metallization through said conductive polysilicon to said metallic-like material.

14. An IC chip as in claim 12 wherein said refractory, metallic-like material adjacent said upper polysilicon layer is selected from the group of TiN, TiW and W.

15. An IC chip as in claim 12, wherein said metallic-like material is TiN.

16. An IC chip as in claim 12, wherein said metallic-like material adjacent said lower polysilicon layer is a silicide compound.

17. An IC chip as in claim 16, wherein said silicide compound is selected from the group of $TiSi_2$, $CoSi_2$ and $WSi_2$.

18. The method of forming a capacitor on a substrate to serve as part of an integrated circuit, comprising the steps of:

supporting a first layer of polysilicon on said substrate;

forming a layer of metallic-like material on the upper surface of said first layer of polysilicon to serve as the lower plate of the capacitor;

forming dielectric insulation above said layer of metallic-like material;

forming a layer of a refractory, metallic-like material on the upper surface of said dielectric insulation to serve as the upper plate of the capacitor; and forming a second layer of polysilicon above said metallic-like material.

19. The method of claim 18, wherein said metallic-like layer is formed by:

depositing a layer of a metallic element on said dielectric insulation; and directly reacting said metallic element with a gas to form a metallic compound.

20. The method of claim 18, wherein said metallic element is titanium (Ti).

21. The method of claim 20, wherein said gas includes nitrogen.

22. The method of claim 21, wherein said layer of titanium is between 50 Å and 1000 Å thick.

23. The method of claim 1, wherein said gas is reacted at a temperature between 450° C. and 700° C.

24. The method of claim 21 wherein said gas comprises $NH_3$.

25. The method of claim 18, wherein said refractory, metallic-like material includes titanium deposited by reactive sputter in an $N_2$ ambient to form TiN.

26. The method of claim 18, wherein said refractory, metallic-like material is a compound formed by sputter deposition from a corresponding target compound.

27. The method of claim 26, wherein said metallic-like compound is TiN formed by sputter deposition from a TiN target.

* * * * *